United States Patent
Liu et al.

(10) Patent No.: US 8,797,494 B2
(45) Date of Patent: Aug. 5, 2014

(54) DISPLAY DEVICE AND METHOD FOR MANUFACTURING THE SAME

(71) Applicant: AU Optronics Corp., Hsin-Chu (TW)

(72) Inventors: Chih-Che Liu, Hsin-Chu (TW); Shih-Feng Hsu, Hsin-Chu (TW)

(73) Assignee: AU Optronics Corp., Science-Based Industrial Park, Hsin-Chu (KR)

( * ) Notice: Subject to any disclaimer, the term of this patent is extended or adjusted under 35 U.S.C. 154(b) by 0 days.

(21) Appl. No.: 14/147,571

(22) Filed: Jan. 5, 2014

(65) Prior Publication Data

US 2014/0102635 A1  Apr. 17, 2014

Related U.S. Application Data

(62) Division of application No. 13/224,293, filed on Sep. 1, 2011, now Pat. No. 8,670,092.

(30) Foreign Application Priority Data

Jun. 13, 2011  (TW) .............. 100120546 A

(51) Int. Cl.
- *G02F 1/1333* (2006.01)
- *H01L 51/56* (2006.01)
- *G02F 1/1335* (2006.01)
- *G02F 1/1345* (2006.01)
- *G02F 1/1339* (2006.01)

(52) U.S. Cl.
CPC .... *H01L 51/56* (2013.01); *G02F 2001/133388* (2013.01); *G02F 2201/50* (2013.01); *G02F 1/13454* (2013.01); *G02F 1/1339* (2013.01); *G02F 1/133512* (2013.01)

USPC .............. 349/153; 349/190; 349/110

(58) Field of Classification Search
None
See application file for complete search history.

(56) References Cited

U.S. PATENT DOCUMENTS

| 7,375,790 | B2 | 5/2008 | Yun | |
|---|---|---|---|---|
| 2004/0246430 | A1* | 12/2004 | Shih | .............. 349/153 |
| 2010/0045916 | A1 | 2/2010 | Kim | |
| 2011/0043742 | A1 | 2/2011 | Cavanaugh | |

FOREIGN PATENT DOCUMENTS

| CN | 1637567 A | 7/2005 |
|---|---|---|
| CN | 101713883 B | 7/2012 |
| CN | 101539680 B | 8/2012 |
| JP | 2001319776 | 11/2001 |
| JP | 2011070017 A | 4/2011 |
| KR | 101023307 B1 | 3/2011 |
| TW | I251913 | 3/2006 |

* cited by examiner

*Primary Examiner* — Thanh-Nhan P Nguyen
(74) *Attorney, Agent, or Firm* — Winston Hsu; Scott Margo

(57) ABSTRACT

A display device includes a first substrate, a second substrate and a sealing material. The first substrate includes an active area and a driving circuit. The driving circuit has a first side facing the active area and a second side opposite to the first side. The second substrate includes a mask layer. A projection of the mask layer on the first substrate at least overlaps the driving circuit from the second side to the first side. The sealing material is between the second substrate and the first substrate, used for sealing the second substrate and the first substrate, and located beside the second side of the driving circuit.

9 Claims, 4 Drawing Sheets the patent

DISPLAY DEVICE AND METHOD FOR MANUFACTURING THE SAME

CROSS REFERENCE TO RELATED APPLICATIONS

This is a division application of Ser. No. 13/224,293, now pending, filed on Sep. 1, 2011.

BACKGROUND OF THE INVENTION

1. Field of the Invention

The invention relates to a display device and a method for manufacturing the same and, more particularly, to a display device, which integrates a mask layer with a substrate, and a method for manufacturing the same.

2. Description of the Prior Art

Recently, various flat panel displays (FDPs) have been developed sequentially, such as liquid crystal display (LCD), organic light emitting diode (OLED) display, plasma display panel (PDP) display, and so on. The flat panel display is being used to replace cathode ray tube (CRT) display gradually.

In general, the process of manufacturing a conventional display comprises providing a front substrate and a rear substrate, assembling the front substrate with the rear substrate, and performing package process for the front substrate and the rear substrate. A conventional package process usually comprises steps of forming a sealing material on the front substrate, on the rear substrate, or around both the front and rear substrates and using a laser beam to irradiate the sealing material after assembling the front substrate with the rear substrate, so as to seal the front and rear substrates by the sealing material. In laser process, a beam size of the laser beam is usually larger than a width of the sealing material. To prevent an active area and a driving circuit, which are outside the package area, from being damaged by the laser beam and to raise yield rate, the prior art disposes a sealing mask on the front substrate for protection during the laser process.

Most of the sealing masks are manufactured by plating a glass with a metal film. To prevent the laser head from being damaged by the laser beam, which is reflected by the metal film, it is necessary to install an alignment system for the sealing mask, so as to align the sealing mask with the laser beam before the laser process. The manufacture cost will increase due to the alignment system and the total assembly time will also increase due to the alignment of the sealing mask. Furthermore, the price of manufacturing the sealing mask is very expensive since the size of the sealing mask has to be larger than the size of the substrate and the sealing mask can only be used for a few months, such that the manufacture cost will further increase.

SUMMARY OF THE INVENTION

Therefore, an objective of the invention is to provide a display device, which integrates a mask layer with a substrate, and a method for manufacturing the same.

According to an embodiment of the invention, a display device comprises a first substrate, a second substrate and a sealing material. The first substrate comprises an active area and a driving circuit. The driving circuit has a first side facing the active area and a second side opposite to the first side. The second substrate comprises a mask layer. A projection of the mask layer on the first substrate at least overlaps the driving circuit from the second side to the first side. The sealing material is between the second substrate and the first substrate, used for sealing the second substrate and the first substrate, and located beside the second side of the driving circuit.

According to another embodiment of the invention, a method for manufacturing a display device comprises providing a first substrate and forming an active area and a driving circuit on the first substrate, wherein the driving circuit has a first side facing the active area and a second side opposite to the first side; providing a second substrate and forming a mask layer and a sealing material on the second substrate; assembling the first substrate and the second substrate, wherein the sealing material is between the second substrate and the first substrate and located beside the second side of the driving circuit, and a projection of the mask layer on the first substrate at least overlaps the driving circuit from the second side to the first side; and using a laser beam to irradiate the sealing material, wherein part of the laser beam, which exceeds an area of the sealing material, irradiates on the mask layer.

As mentioned in the above, the invention integrates the mask layer with the second substrate (e.g. front substrate) and makes the projection of the mask layer on the first substrate (e.g. rear substrate) at least overlap the driving circuit from the second side to the first side, so as to prevent the driving circuit, which is outside the package area, from being damaged by the laser beam during laser process. Accordingly, the invention does not need the expensive sealing mask and the alignment system for the sealing mask and can reduce the assembly time without the sealing mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
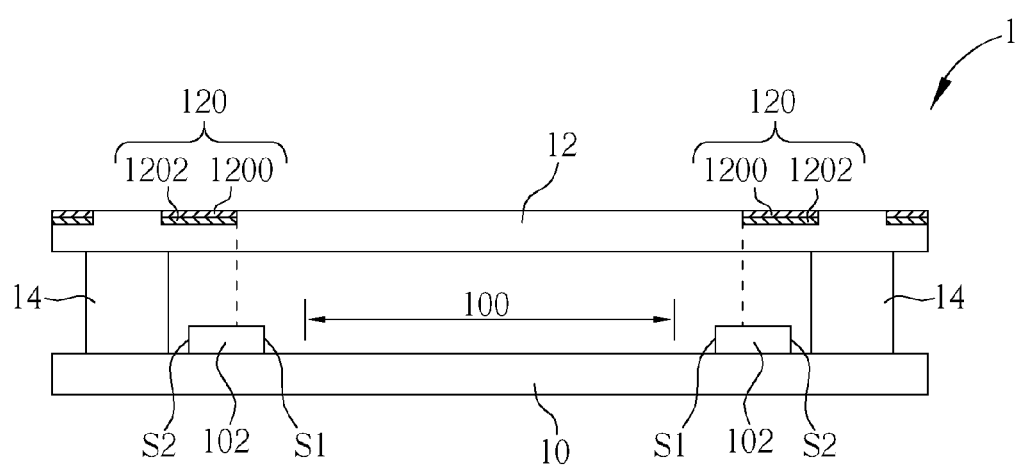
FIG. 1 is a side view illustrating a display device according to one embodiment of the invention.
Figure 2:
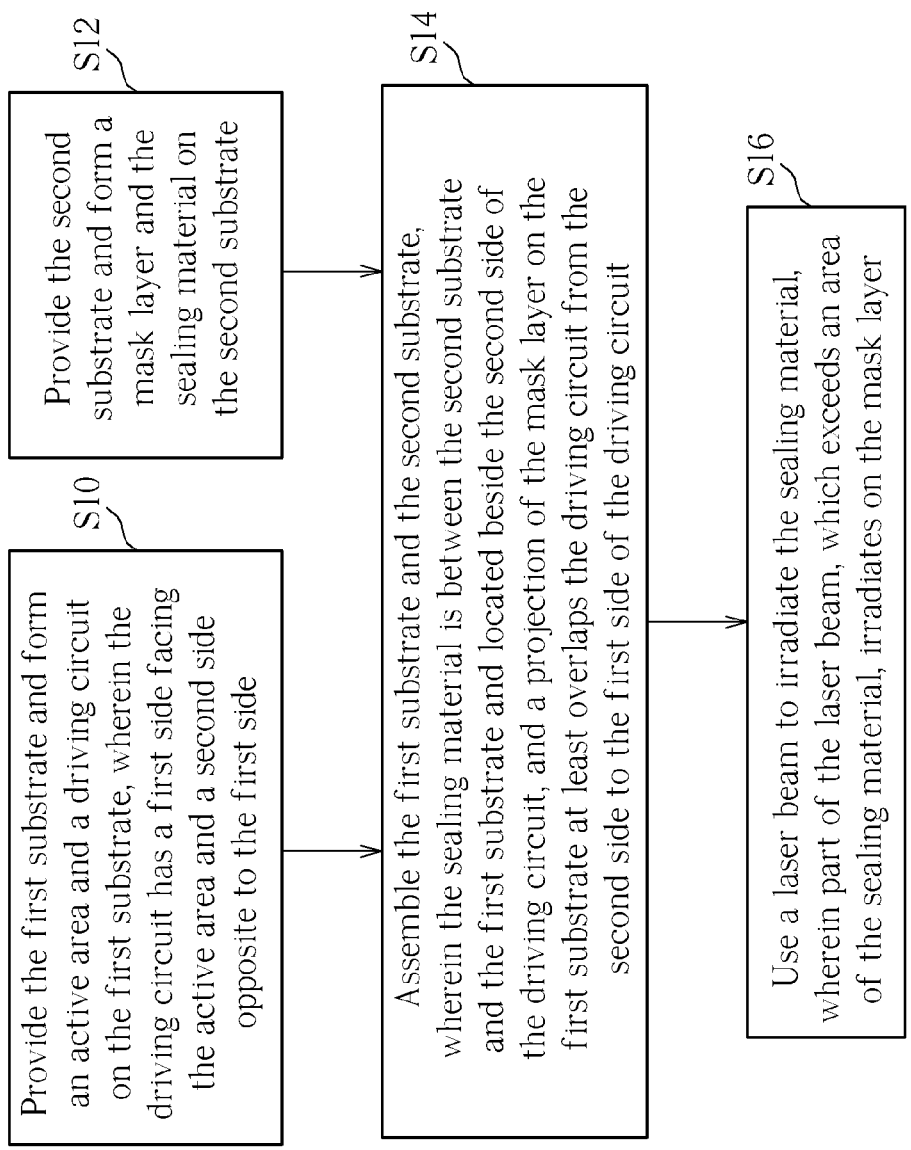
FIG. 2 is a flowchart showing a method for manufacturing the display device shown in FIG. 1.
Figure 3:
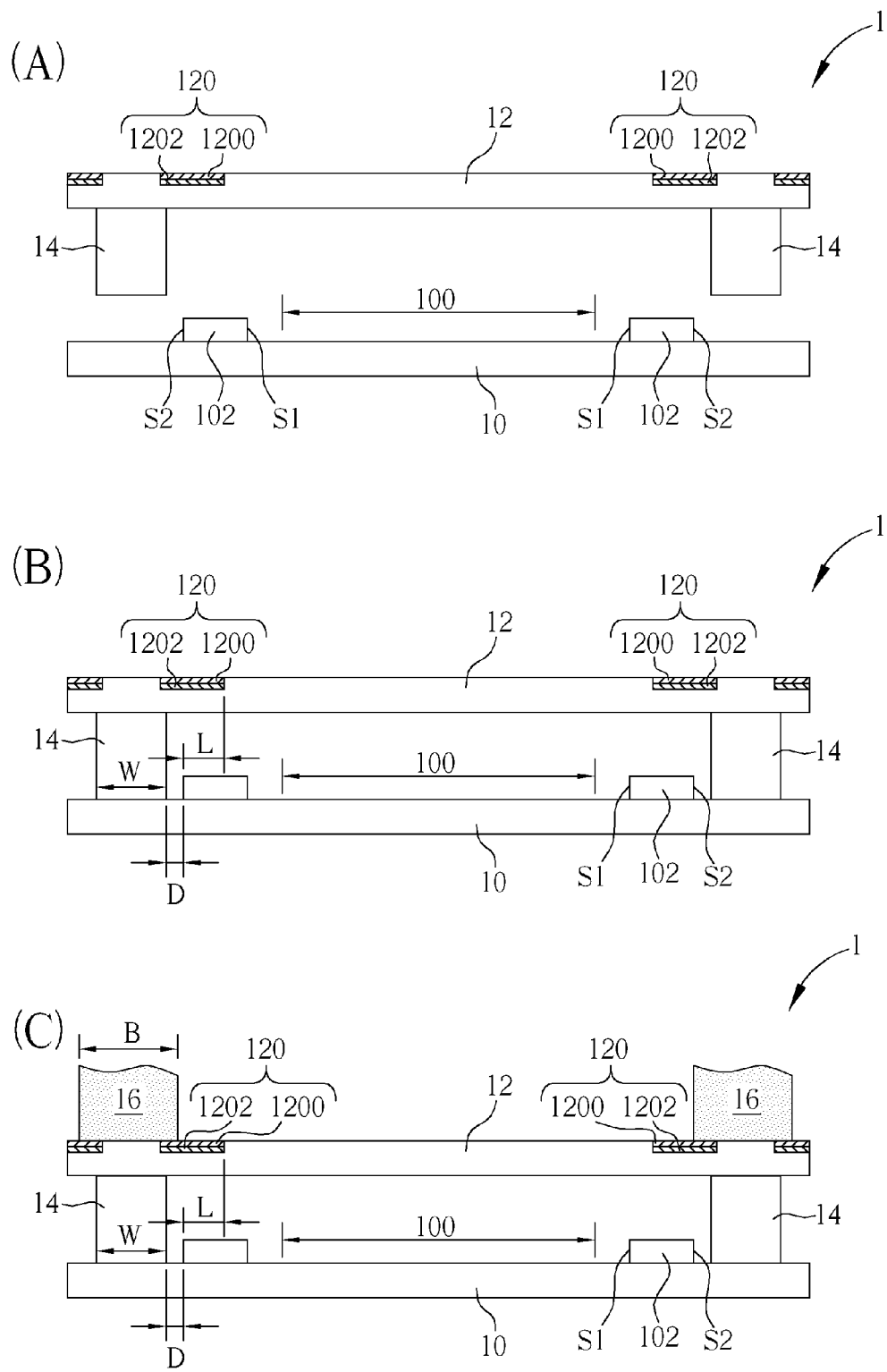
FIG. 3 is a schematic diagram illustrating manufacture process along with FIG. 2.

Referring to FIGS. 1 to 3, FIG. 1 is a side view illustrating a display device 1 according to one embodiment of the invention, FIG. 2 is a flowchart showing a method for manufacturing the display device 1 shown in FIG. 1, and FIG. 3 is a schematic diagram illustrating manufacture process along with FIG. 2. As shown in FIG. 1, the display device 1 comprises a first substrate 10, a second substrate 12 and a sealing mask 14. The display device 1 may be a liquid crystal display (LCD), an organic light emitting diode (OLED) display, a plasma display panel (PDP) display, and so on, and it depends on practical applications. The first substrate 10 and the second substrate 12 may be, but not limited to, glass substrates, and the sealing material 14 may be, but not limited to, a frit. When the sealing material 14 is a frit, the package process may be glass frit sealing process.

As show in FIGS. 2 and 3, when manufacturing the display device 1, step S10 is performed first to provide the first substrate 10 and form an active area 100 and a driving circuit 102 on the first substrate 10, wherein the driving circuit 102 has a first side S1 facing the active area 100 and a second side S2 opposite to the first side S1, as shown in FIG. 3(A). Furthermore, step S12 is performed to provide the second substrate 12 and form a mask layer 120 and the sealing material 14 on the second substrate 12, as shown in FIG. 3(A). It should be noted that during the process of manufacturing a substrate of an OLED display, a metal wire is used to increase conductivity, so the mask layer 120 can be formed on the second substrate 12 while forming the metal wire without additional process if the display device is an OLED display. Furthermore, the driving circuit 102 may be, but not limited to, a voltage-shift resistor (VSR) and/or thin-film transistor (TFT) driving circuit, and it depends on the type of the display device 1.

In this embodiment, the mask layer 120 may comprise a first metal layer 1200 and a second metal layer 1202, wherein the first metal layer 1200 is made of a high reflective metal material and the second metal layer 1202 is made of a high heat-resisting metal material. The aforesaid high reflective metal material may comprise at least one selected from a group consisting of: aluminum, silver, and an alloy thereof, and the aforesaid high heat-resisting metal material may comprise at least one selected from a group consisting of: molybdenum, copper, titanium, chromium, and an alloy thereof. Furthermore, a thickness of the first metal layer 1200 may be between 500 Å and 5000 Å, and a thickness of the second metal layer 1202 may be between 500 Å and 5000 Å. For example, when the first metal layer 1200 is aluminum and the second metal layer 1202 is copper, the thickness of the first metal layer 1200 is preferably equal to 500 Å and the thickness of the second metal layer 1202 is preferably equal to 1500 Å. It should be noted that the mask layer 120 may be a compound metal layer consisting of more than two metal or alloy layers and is not limited to two layers shown in the figures.

As shown in FIGS. 2 and 3, after steps S10 and S12, step S14 is then performed to assemble the first substrate 10 and the second substrate 12, wherein the sealing material 14 is between the second substrate 12 and the first substrate 10 and located beside the second side S2 of the driving circuit 102 (a distance D exists between the sealing material 14 and the second side S2 of the driving circuit 102), and a projection of the mask layer 120 on the first substrate 10 at least overlaps the driving circuit 102 from the second side S2 to the first side S1 of the driving circuit 102, as shown in FIG. 3(B). In this embodiment, the projection of the mask layer 120 on the first substrate 10 does not overlap the active area 100, so as to prevent the active area 100 from being shielded by the mask layer 120.

Finally, step S16 is performed to use a laser beam 16 to irradiate the sealing material 14, wherein part of the laser beam 16, which exceeds an area of the sealing material 14, irradiates on the mask layer 120, as shown in FIG. 3(C). In step S16 of this embodiment, the laser beam 16 irradiates the sealing material 14 over the second substrate 12 so as to seal the second substrate 12 and the first substrate 10. To prevent the driving circuit 102, which is outside the package area, from being damaged by the laser beam 16 during laser process, an overlapped length between the projection of the mask layer 120 on the first substrate 10 and the driving circuit 102 has to satisfy an inequality 1 as follows, $$\text{Inequality 1: } L \geq \frac{B-W}{2} - D.$$

In the aforesaid inequality 1, L represents the overlapped length between the projection of the mask layer 120 on the first substrate 10 and the driving circuit 102, B represents a beam size of the laser beam 16, W represents a width of the sealing material 14, and D represents the distance between the driving circuit 102 and the sealing material 14.

Since the first metal layer 1200 and the second metal layer 1202 of the mask layer 120 are made of high reflective metal material and high heat-resisting metal material respectively, part of the laser beam 16, which irradiates on the mask layer 120, can be reflected effectively and heat generated by the laser beam 16 can be absorbed effectively when the laser beam 16 irradiates the sealing material 14 over the second substrate 12, so as to prevent the driving circuit 102, which is outside the package area, from being damaged by the laser beam 16 during laser process.

Figure 4:
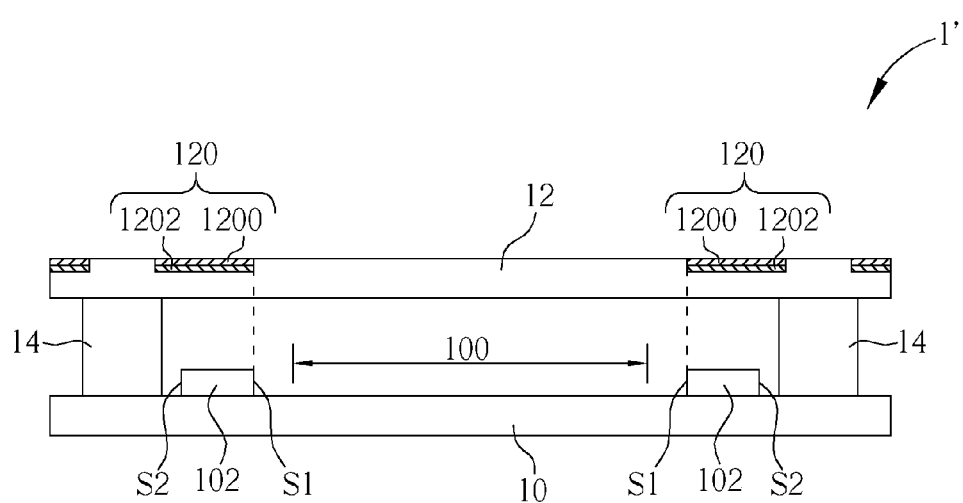
FIG. 4 is a side view illustrating a display device according to another embodiment of the invention.

Referring to FIG. 4, FIG. 4 is a side view illustrating a display device 1' according to another embodiment of the invention. As shown in FIGS. 4 and 1, the main difference between the display device 1' and the aforesaid display device 1 is that the projection of the mask layer 120 of the display device 1' on the first substrate 10 completely overlaps the driving circuit 102. Accordingly, this embodiment can prevent the driving circuit 102, which is outside the package area, from being damaged by the laser beam 16 during laser process more effectively. In this embodiment, the projection of the mask layer 120 on the first substrate 10 does not overlap the active area 100, so as to prevent the active area 100 from being shielded by the mask layer 120. It should be noted that the principles of the components with identical labels in FIGS. 4 and 1 are substantially the same, so they will not be depicted herein again.

Compared to the prior art, the invention integrates the mask layer with the second substrate (e.g. front substrate) and makes the projection of the mask layer on the first substrate (e.g. rear substrate) at least overlap the driving circuit from the second side to the first side, so as to prevent the driving circuit, which is outside the package area, from being damaged by the laser beam during laser process. Accordingly, the invention does not need the expensive sealing mask and the alignment system for the sealing mask and can reduce the assembly time without the sealing mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a display device comprising:
   providing a first substrate and forming an active area and a driving circuit on the first substrate, wherein the driving circuit has a first side facing the active area and a second side opposite to the first side;
   providing a second substrate and forming a mask layer and a sealing material on the second substrate;
   assembling the first substrate and the second substrate, wherein the sealing material is between the second substrate and the first substrate and located beside the second side of the driving circuit, and a projection of the mask layer on the first substrate at least overlaps the driving circuit from the second side to the first side; and
   using a laser beam to irradiate the sealing material, wherein part of the laser beam passes through the second substrate first and then irradiates on the sealing material, and another part of the laser beam, which exceeds an area of the sealing material, irradiates on the mask layer, so as to prevent the laser beam from irradiating on the driving circuit.

2. The method of claim 1, wherein an overlapped length between the projection of the mask layer on the first substrate and the driving circuit satisfies an inequality as follows:

$$L \geq \frac{B-W}{2} - D;$$

wherein L represents the overlapped length between the projection of the mask layer on the first substrate and the driving circuit, B represents a beam size of a laser beam used for irradiating the sealing material, W represents a width of the sealing material, and D represents a distance between the driving circuit and the sealing material.

3. The method of claim 1, wherein the projection of the mask layer on the first substrate completely overlaps the driving circuit.

4. The method of claim 1, wherein the projection of the mask layer on the first substrate does not overlap the active area.

5. The method of claim 1, wherein the mask layer comprises a first metal layer and a second metal layer, the first metal layer is made of a high reflective metal material, and the second metal layer is made of a high heat-resisting metal material.

6. The method of claim 5, wherein the high reflective metal material comprises at least one selected from a group consisting of: aluminum, silver, and an alloy thereof, and the high heat-resisting metal material comprises at least one selected from a group consisting of: molybdenum, copper, titanium, chromium, and an alloy thereof.

7. The method of claim 5, wherein a thickness of the first metal layer is between 500 Å and 5000 Å, and a thickness of the second metal layer is between 500 Å and 5000 Å.

8. The method of claim 1, wherein the sealing material comprises a frit.

9. The method of claim 1, wherein using a laser beam to irradiate the sealing material further comprises:

using a laser beam to irradiate the sealing material over the second substrate.

* * * * *